United States Patent [19]
Murphy et al.

[11] Patent Number: 5,572,776
[45] Date of Patent: Nov. 12, 1996

[54] FASTENER EMPLOYING A BI-STABLE MECHANISM

[75] Inventors: Morgan D. Murphy; Dale J. Igram, both of Kokomo, India.

[73] Assignee: Delco Electronics Corporation, Kokomo, India.

[21] Appl. No.: 353,744

[22] Filed: Dec. 12, 1994

[51] Int. Cl.$^6$ .............................. F16B 7/00; F16L 3/00
[52] U.S. Cl. ................... 24/543; 248/74.2; 248/316.5; 24/487
[58] Field of Search ............................ 24/543, 487, 495; 248/74.1–74.3, 69, 316.5, 316.7, 113

[56] References Cited

U.S. PATENT DOCUMENTS

| | | | |
|---|---|---|---|
| 3,512,227 | 5/1970 | Krawagna | 248/113 |
| 4,612,680 | 9/1986 | Daiguji | 248/74.3 X |
| 4,763,390 | 8/1988 | Rooz | 24/487 |
| 4,955,574 | 9/1990 | Freier | 248/74.2 X |
| 5,230,496 | 7/1993 | Shillington et al. | 24/543 X |
| 5,277,387 | 1/1994 | Lewis et al. | 24/487 X |
| 5,312,081 | 5/1994 | Martin | 248/113 X |
| 5,414,911 | 5/1995 | Adams | 24/543 X |

FOREIGN PATENT DOCUMENTS

| | | | |
|---|---|---|---|
| WO78/00003 | 12/1978 | Germany | 24/487 |

*Primary Examiner*—Peter M. Cuomo
*Assistant Examiner*—Robert J. Sandy
*Attorney, Agent, or Firm*—Jimmy L. Funke

[57] ABSTRACT

A snap-action fastener suitable for joining two or more members using automated or manual assembly techniques. The fastener includes a pair of legs spaced apart and having complementary ends, with each of the legs being formed so as to be resilient in bending. Flexibly attached to the complementary ends of the legs are first and second arms, respectively. The arms are attached to the legs so as to form first and second hinges, respectively. The arms can be attached to the complementary ends at a midpoint or an end of each arm. Furthermore, the arms are flexibly attached to each other so as to form a third hinge intermediate the first and second hinges. To generate the desired snap-action, the combined lengths of the arms between the complementary ends of the legs is greater than the distance between the complementary ends, such that the snap-action occurs during operation of the fastener between a release position and a fastening position. The fastener further includes a coupling member which is specifically configured so as to be operatively associated with the arms. In particular, the coupling member is configured to secure a first member to a second member when the first member is interconnected with the legs and the fastener is in the fastening position. The above structure provides a bi-stable mechanism which is capable of variations for tailoring the fastener to a variety of applications.

18 Claims, 5 Drawing Sheets

FASTENER EMPLOYING A BI-STABLE MECHANISM

The present invention generally relates to reversible snap-action type fasteners. More particularly, this invention relates to a fastener whose snap-action is derived from a bi-stable mechanism which enables the fastener to be readily adapted to numerous fastening applications, particularly in the electronics industry.

BACKGROUND OF THE INVENTION

Numerous varieties of fasteners have been developed in response to the diversity of applications for which fasteners can be used. As manufacturing processes become more automated, there has been an increased emphasis on developing fasteners which simplify and facilitate assembly, yet which are capable of reliably securing the particular members being joined. Such a need particularly exists in the electronics industry for the purpose of reliably securing circuit boards and various components to a support frame or chassis of an enclosure, cabinet and casing.

Fasteners suitable for the above types of applications generally must be capable of being installed without damage to the circuit board or component and the support member to which it is to be secured, yet must also provide secure and reliable attachment so as ensure sufficient vibration resistance. Conventionally, threaded fasteners are widely used to secure circuit boards to a chassis, at times incorporating a self-locking feature to discourage the fastener from becoming loose due to vibration.

However, a significant disadvantage associated with the use of threaded fasteners is that they require a rotational motion for installation. In terms of automated assembly methods, fasteners that require a rotational motion add significant costs to the assembly process. When manual assembly methods are used, threaded fasteners are often undesirable in that carpal tunnel syndrome has been linked to the ratcheting motion required to install such fasteners.

Consequently, various types of nonthreaded fasteners have been proposed, such as fasteners which have a snap-action operation. Snap-action fasteners generally have one or more members which toggle between two stable positions, one of which defines a fastening position while the other is an assembly or release position. It would be desirable if an improved fastener incorporating a bi-stable mechanism were available to provide a reliable, reusable fastener for joining together two or more members, such as a circuit board and a support chassis. Such a fastener would preferably enable a straight push-in type assembly, facilitate installation and removal procedures, and obviate the requirement for additional fasteners and special tools for assembly and disassembly.

SUMMARY OF THE INVENTION

It is an object of this invention to provide a fastener which is particularly adapted to secure together two or more members, such as a circuit board or electrical component and a support structure.

It is another object of this invention that such a fastener be capable of generating a clamping load which resists loosening due to vibration.

It is a further object of this invention that such a fastener be readily installable through the application of a moderate assembly force on the fastener or the members to be joined.

It is a yet another object of this invention that the fastener employ a bi-stable mechanism, such that the application of the assembly force toggles the fastener between two stable positions.

It is a yet a further object of this invention that such a fastener be readily manufacturable.

Lastly, it is still a further object of this invention that such a fastener be capable of modification to form a relatively tamper-proof fastener or, alternatively, a fastener which can be readily disengaged to release the members joined by the fastener.

In accordance with a preferred embodiment of this invention, these and other objects and advantages are accomplished as follows.

According to the present invention, there is provided a snap-action fastener suitable for joining two or more members using automated or manual assembly techniques. The fastener is designed to be secured or integrally formed on the members to be joined, and is particularly adapted for securing a circuit board or electrical component to a support member, frame or chassis. Furthermore, the fastener is relatively light weight, can be configured to permit disassembly of the joined members, and subsequently reused.

The fastener of this invention is characterized by a simplified assembly procedure, in that only a moderate force is necessary to join and disassemble the members, yet the fastener is resistant to vibrational forces. Furthermore, the fastener is conducive to both automated and manual assembly methods, in that a rotational motion is not required during assembly.

The fastener of this invention generally includes first and second legs spaced apart and having a pair of complementary ends, with each of the legs being formed so as to be resilient in bending. Flexibly attached to the complementary ends of the first and second legs are first and second arms, respectively. The arms are attached to the first and second legs so as to form first and second hinges, respectively. The arms can be attached to the complementary ends at a midpoint or an end of each arm. Furthermore, the arms are flexibly attached to each other so as to form a third hinge intermediate the first and second hinges.

To generate the desired snap-action, the combined lengths of the arms between the complementary ends of the legs is greater than the distance between the complementary ends, such that the snap-action occurs during operation of the fastener between a release position and a fastening position.

Finally, the fastener of this invention includes a coupling member which is specifically configured so as to be operatively associated with the arms. In particular, the coupling member is configured to secure a first member to a second member when the first member is interconnected with the legs and the fastener is in the fastening position.

The above generic structure provides a bi-stable mechanism which is capable of variations for tailoring the fastener to a variety of applications. For example, the coupling member can be configured to be secured directly to the second member, or secured to one of the arms. In the former configuration, the arms act to clasp the coupling member when the snap-action fastener is in the fastening position, while the latter configuration provides a structure in which the second member is clamped by the coupling member against a portion of the fastener. In addition, the fastener can be configured such that, when the snap-action fastener is in the fastening position, the ends of the arms are either adjacent or remote from each other. Additional variations include equipping the arms with locking features, such that the arms will interlock with each other or will otherwise engage each other so as to secure the first arm to the second arm.

As described above, the snap-action fastener of this invention is capable of being tailored to a variety of applications in which two members are to be secured to each other. For example, such members can be a circuit board and support structure, fiber optic bundles routed through and secured to an instrument panel, a pair of panel members intended to be secured face-to-face, as well as a multitude of other applications in which one or more components of moderate mass are to be secured in a manner which is resistant to vibration.

The fastener is generally configured to be operated with a simple push to secure and release the components. However, when the assembly is to be tamper-proof, the arms can be equipped with locking features, such that the fastener will resist being forced into the release position unless properly operated.

In addition to the operational advantages of the fastener of this invention, the fastener is also configured to be readily formed in a one-step molding operation, so as to minimize material and production costs.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1A:
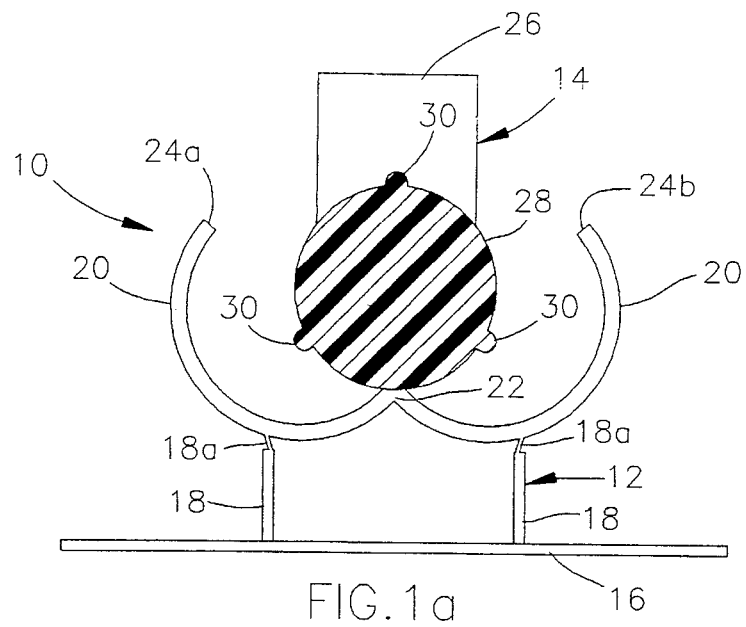
FIGS. 1a and 1b illustrate a bi-stable fastener and its operation in accordance with a first embodiment of this invention.
Figure 1B:
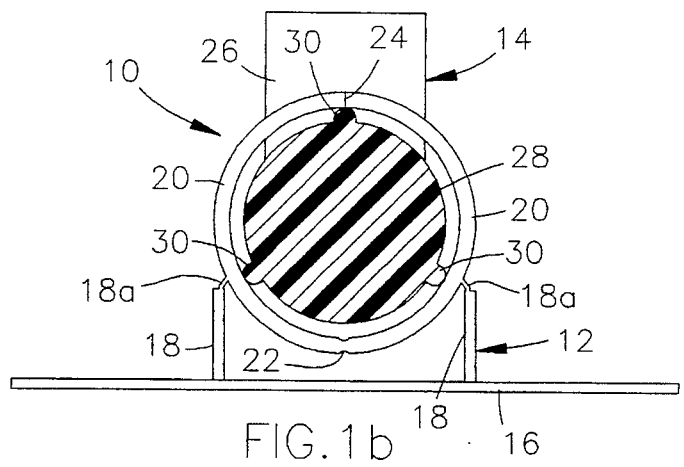

Illustrated in FIGS. 1a and 1b is a snap-action fastener assembly 10 which is capable of securing two members together in a manner which is resistant to vibration. In accordance with this invention, the fastener assembly 10 is but one of several variations which employ a bi-stable mechanism that provides a desirable snap-action fastening function. In the embodiment of FIGS. 1a and 1b, the fastener assembly 10 is generally composed of a bi-stable mechanism 12 and a coupling member 14, each of which is adapted to be mounted, secured or otherwise attached to one of the members to be joined by the fastener assembly 10. As such, the bi-stable mechanism 12 and the coupling member 14 are operatively associated with each other for the purpose of securing a first member (not shown), to which the bi-stable mechanism 12 is secured, to a second member (not shown) to which the coupling member 14 is secured.

FIG. 1a illustrates the fastening assembly 10 positioned in a release position, while FIG. 1b illustrates the fastening assembly 10 positioned in a fastening position. With reference to both FIGS. 1a and 1b, the bi-stable mechanism 12 generally includes a base 16 from which two legs 18 extend substantially in parallel. Flexibly attached to the upper end of each leg 18 is an arm 20. Each leg 18 and arm 20 pairing forms a hinge 18a which permits the arms 20 to rotate about their respective legs 18. The arms 20 are also flexibly attached to each other, so as to form a third hinge 22 between the arms 20 which is approximately centered between the legs 18.

To enable a suitable degree of flexibility, at least those portions of the bi-stable mechanism 12 which are required to flex, including portions of the legs 18, portions of the arms 20, and the hinges 18a and 22, are formed from plastic material. Suitable plastic materials include polypropylene and nylon, though it is foreseeable that numerous other resilient materials could be used. In this embodiment, the arms 20 have an arcuate shape, each terminating in a distal end 24a, 24b. As shown, the combined lengths of the arms 20 between the ends of the legs 18 is greater than the distance between the legs 18, such that the third hinge 22 is the center of a bi-stable snap-action during the operation of the fastener assembly 10 between the release position of FIG. 1a and the fastening position of FIG. 1b.

Between the oppositely disposed stable positions of the bi-stable mechanism 12, the legs 18 are resiliently forced slightly apart in order to accommodate the combined length of the arms 20 between the upper ends of the legs 18. Consequently, the fastening assembly 10 resists being forcibly toggled between the fastening position and the release position, in that forcibly spreading the arms 20 apart results in a greater clamping force being generated by the bi-stable mechanism 12 due to the increased flexure of the legs 18.

As best seen in FIG. 1a, the coupling member 14 includes a base 26 from which a post 28 projects. Located along the periphery of the post 28 are a number of resilient projections 30. In accordance with this invention, the size of the post 28, the effective diameter defined by the projections 30, and the resiliency of the projections combine to form a structure whose effective diameter, as defined by the projections 30, is not less than and preferably slightly greater than the inside diameter of the arms 20 when the fastener assembly 10 is in the fastening position.

This aspect is important to the teachings of this invention in order to yield a fastening system in which two members can be reliably and securely coupled to each other in a manner which will resist vibration. Accordingly, the bi-stable mechanism 12 and the coupling member 14 must be specifically sized to appropriately cooperate with each other. Such a relationship is in contrast to known bi-stable clips available from hardware stores, and designed as hangers from which utensils and tools may be hung from on wall.

Figure 2A:
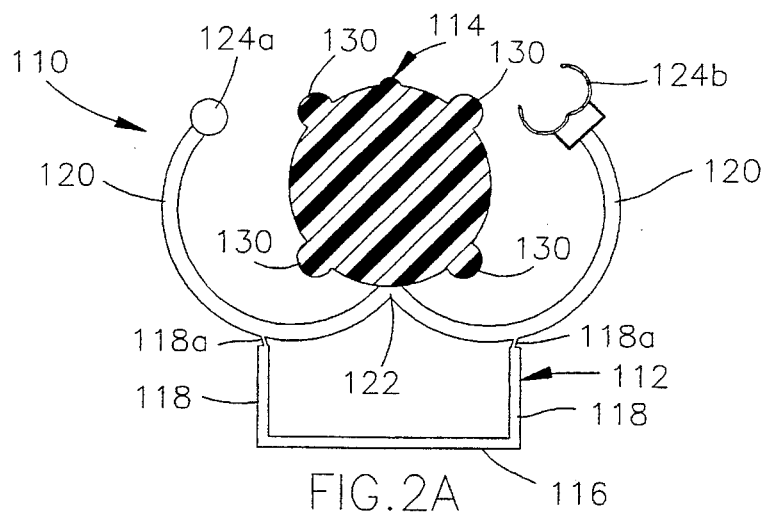
FIGS. 2a and 2b illustrate a bi-stable fastener equipped with locking features in accordance with a second embodiment of this invention.
Figure 2B:
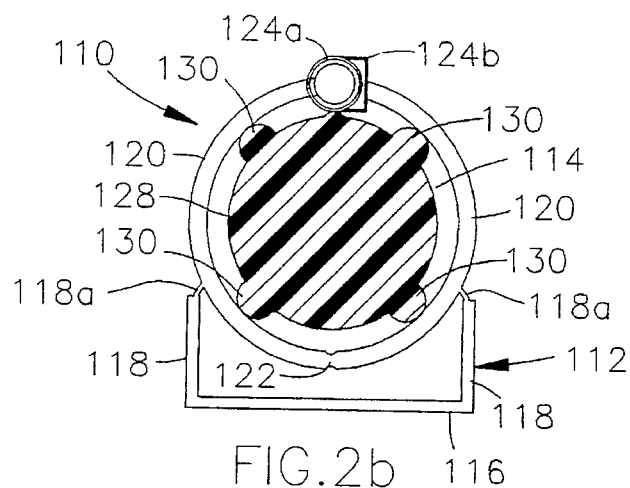

Illustrated in FIGS. 2a and 2b is a snap-action fastener assembly 110 which is similar to that shown in FIGS. 1a and 1b, but modified to make the fastener assembly 110 tamper-resistant. As before, the fastener assembly 110 is generally composed of a bi-stable mechanism 112 and a coupling member 114, each of which is adapted to be secured to one of the members to be joined by the fastener assembly 110. The bi-stable mechanism 112 includes a base 116, two legs 118, and arms 120 flexibly attached to the upper end of each leg 118 so as to form first and second hinges 118a and flexibly attached to each other so as to form a third hinge 122.

Also in accordance with the previous embodiment, the arms 120 have an arcuate shape, with the combined lengths of the arms 120 between the ends of the legs 118 being greater than the distance between the legs 118, such that the third hinge 122 is the center of a bi-stable snap-action during the operation of the fastener assembly 110. However, in contrast to the previous embodiment, each arm 120 terminates in a distal end 124a, 124b which is equipped with a locking feature for the purpose of interlocking the arms 120 when the fastening assembly 110 is in the fastening position.

As shown in FIGS. 2a and 2b, the locking feature disposed at the distal end 124a is a post, much the same in appearance and function as the post 28 of FIGS. 1a and 1b. As also shown, the locking feature disposed at the distal end 124b is a bi-stable mechanism, preferably constructed and operating in the same manner as the bi-stable mechanism 12 of FIGS. 1a and 1b.

Advantageously, with the above construction, the fastening assembly 110 is resistant to being forcibly toggled between the fastening position and the release position. In fact, an attempt to forcibly spread the arms 120 apart results in a greater clamping force being generated by the bi-stable mechanism on the distal end 124b.

Figure 3:
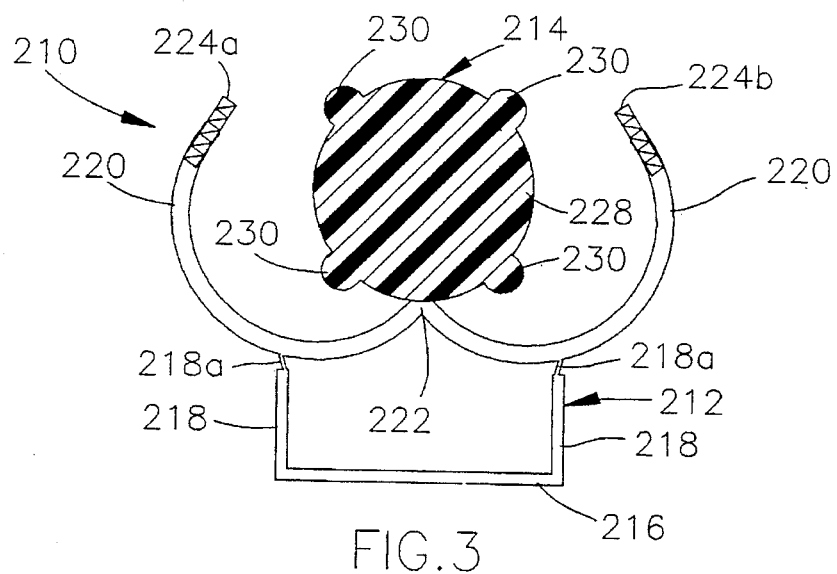
FIG. 3 illustrates a bi-stable fastener equipped with locking features in accordance with a third embodiment of this invention.

A variation on the above is shown in FIG. 3, in which a fastening assembly 210 is shown with each of a pair of arms 220 terminating in a distal end 224a and 224b, but equipped with a locking feature in the form of serrated teeth. Otherwise, the remaining structure is substantially identical to that of the previous embodiment of FIGS. 2a and 2b.

Figure 4:
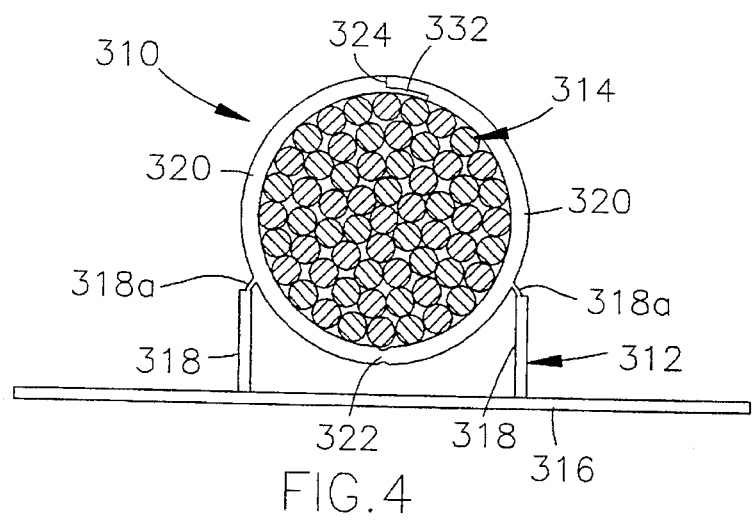
FIGS. 4 and 5 illustrate bi-stable fasteners in accordance with fourth and fifth embodiments of this invention.

Yet a further variation on the basic structure of FIGS. 1a and 1b is shown in FIG. 4. In this embodiment, a fastening assembly 310 is configured for use in securing and orienting a bundle 314 of optic fibers to a support structure (not shown) to which the bi-stable mechanism 312 is secured. With the exception of a guide member 332 attached to a distal end 324 of one of a pair of arms 320, the bi-stable mechanism 312 is essentially identical to that of FIGS. 1a and 1b. The guide member 332 advantageously serves to capture the loose, individual optic fibers in a manner which prevents the fibers from being pinched between the distal ends 324 of the arms 320 when the arms 320 snap toward each other.

A further advantage of this embodiment is that the shape of the arms 320 can be tailored to effect the cross-sectional shape of the fiber bundle 314. For example, where the bundle 314 is to be coupled with a light pipe having a rectangular cross-section, the arms 320 can be fabricated to form a rectangular collar of roughly the same size and shape, which causes the bundle 314 to also have the desired rectangular cross-sectional shape of the light pipe. As a result, coupling of the bundle 314 to the light pipe is facilitated, along with a potential improvement in optical performance.

Figure 5:
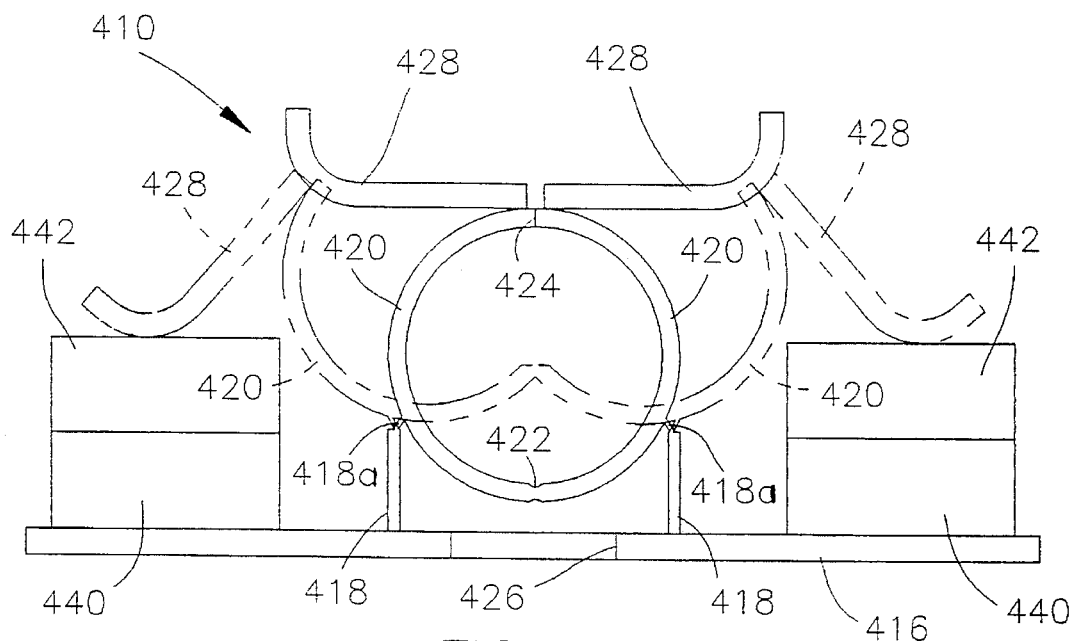

The embodiment of FIG. 5 is unique in comparison to the previous embodiments, in that a coupling member is not required and the release and fastening positions are reversed from that previously shown. As before, the fastener 410 is generally composed of a bi-stable mechanism 412 that includes a base 416, two legs 418, and arms 420 flexibly attached to the upper end of each leg 418 so as to form first and second hinges 418a and flexibly attached to each other so as to form a third hinge 422. Formed in the base 416 of the bi-stable mechanism 412 is an aperture 426 through which access is enabled to the third hinge 422 for toggling the fastener 410 between the release position shown and a clamping position shown in phantom.

As illustrated, the fastener 410 is equipped with a pair of resilient fingers 428 which are attached to the distal ends 424 of the arms 420. In the clamping position, the fingers 428 engage the surface of a first member 442 which is to be secured to a second member 440, to which the fastener 410 is mounted. The fastener 410 may be directly attached to the second member 440, or merely held in place as a result of the clamping force generated by the fingers 428.

Figure 6:
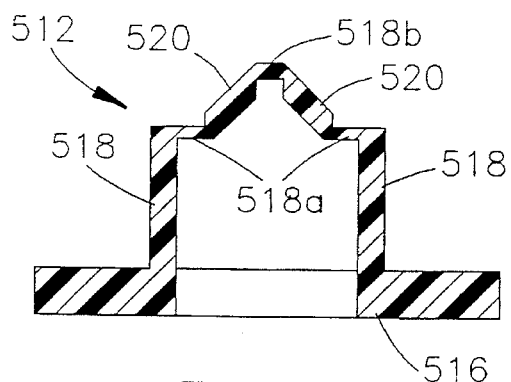
FIG. 6 illustrates a modified bi-stable mechanism in accordance with this invention.

Each of the above fastening systems employ bi-stable mechanisms having a similar construction. Shown in FIG. 6 is a modified bi-stable mechanism 512 adapted to be operatively associated with a coupling member attached directly to the bi-stable mechanism 512. As shown in FIG. 6, the bi-stable mechanism 512 is configured to have a base 516 from which two legs 518 extend substantially in parallel. Flexibly attached to the upper end of each leg 518 is an arm 520. Each leg 518 and arm 520 pairing forms a hinge 518a which permits the arms 520 to rotate about their respective legs 518. The arms 520 are also flexibly attached to each other, so as to form a third hinge 518b between the arms 520 and approximately centered between the legs 518. As before, at least those portions of the bi-stable mechanism 512 which are required to flex are formed from resilient material in order to enable a suitable degree of flexibility.

Figure 7:
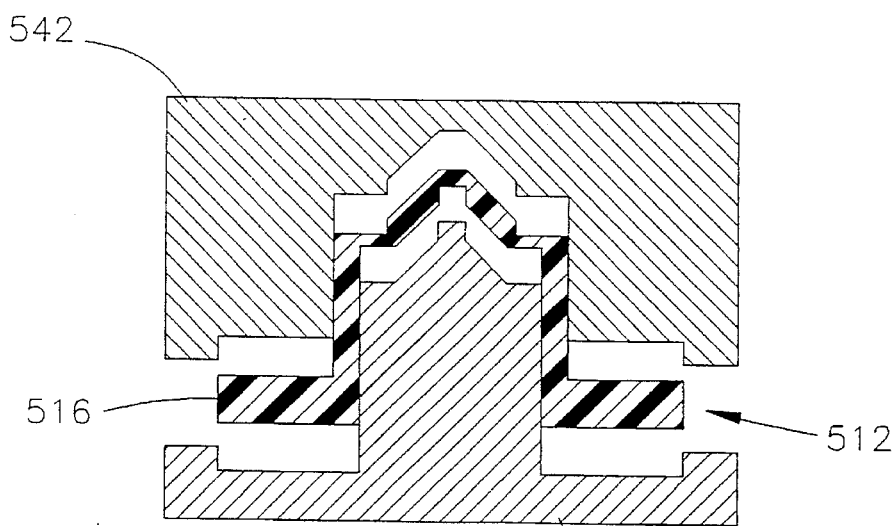
FIG. 7 illustrates the ability to mold the modified bi-stable mechanism of FIG. 6 in a single molding operation.

In contrast to the previous embodiments, the arms 520 of the bi-stable mechanism 512 of this embodiment are not cantilevered, but instead have each of their ends secured either to the legs 518 or each other. As shown in FIG. 7, this construction allows the bi-stable mechanism 512 to be more readily produced by a molding operation through the elimination of any requirement to employ slides between the mold halves 538 used to form the bi-stable mechanism 512. In practice, it is preferable to mold the bi-stable mechanism 512 as shown in FIG. 7, such that the arms 520 are maintained in compression during use.

Figure 8A:
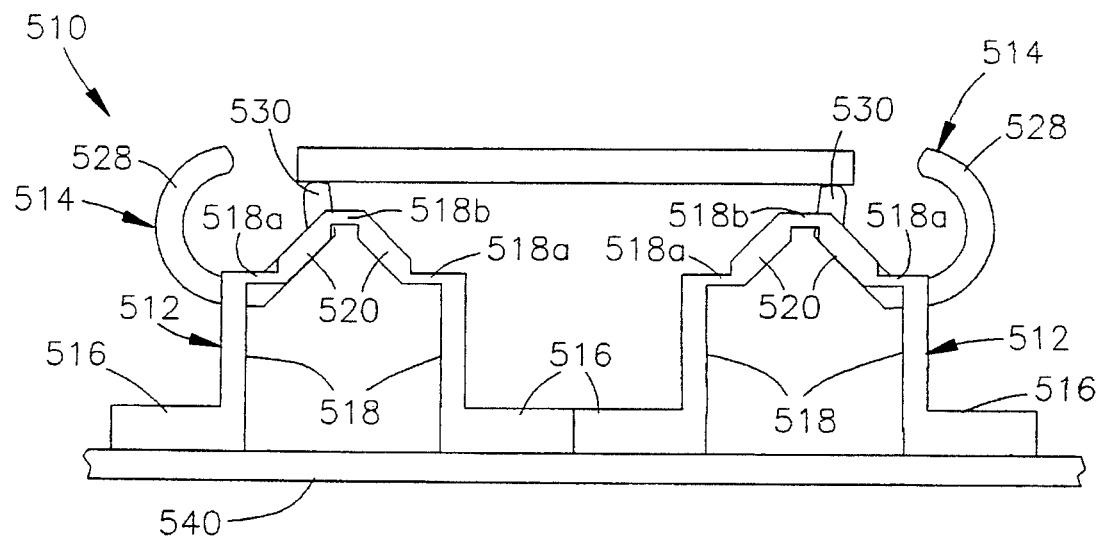
FIGS. 8a and 8b illustrate the use of multiple bi-stable mechanisms configured in accordance with FIG. 6.
Figure 8B:
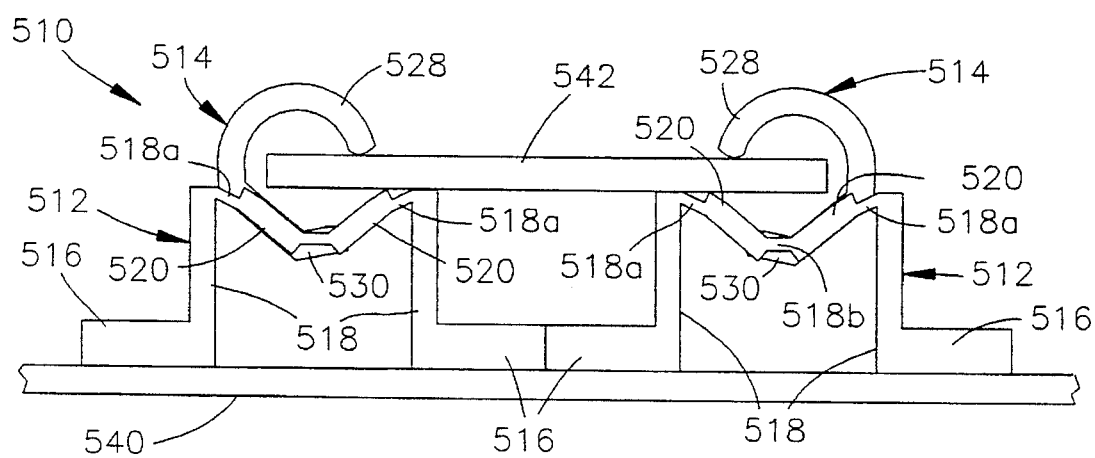

A preferred manner for implementing the bi-stable mechanism 512 of FIG. 6 is shown in FIGS. 8a and 8b. As illustrated, at least two and potentially four bi-stable mechanisms 512 are employed to secure a member 542, such as a circuit board, to a support base 540. Notably, a coupling member 514 is shown as being attached directly to one of the arms 520 of the bi-stable mechanism 512. The coupling member 514 has a generally arcuate shape, one end defining a support 530 while the other end defines a clamping finger 528. The coupling member 514 can be formed integrally with the arm 520 or secured between a pair of adjacent arms of two bi-stable mechanisms 512 mounted side-by-side on the support base 540.

Figure 9A:
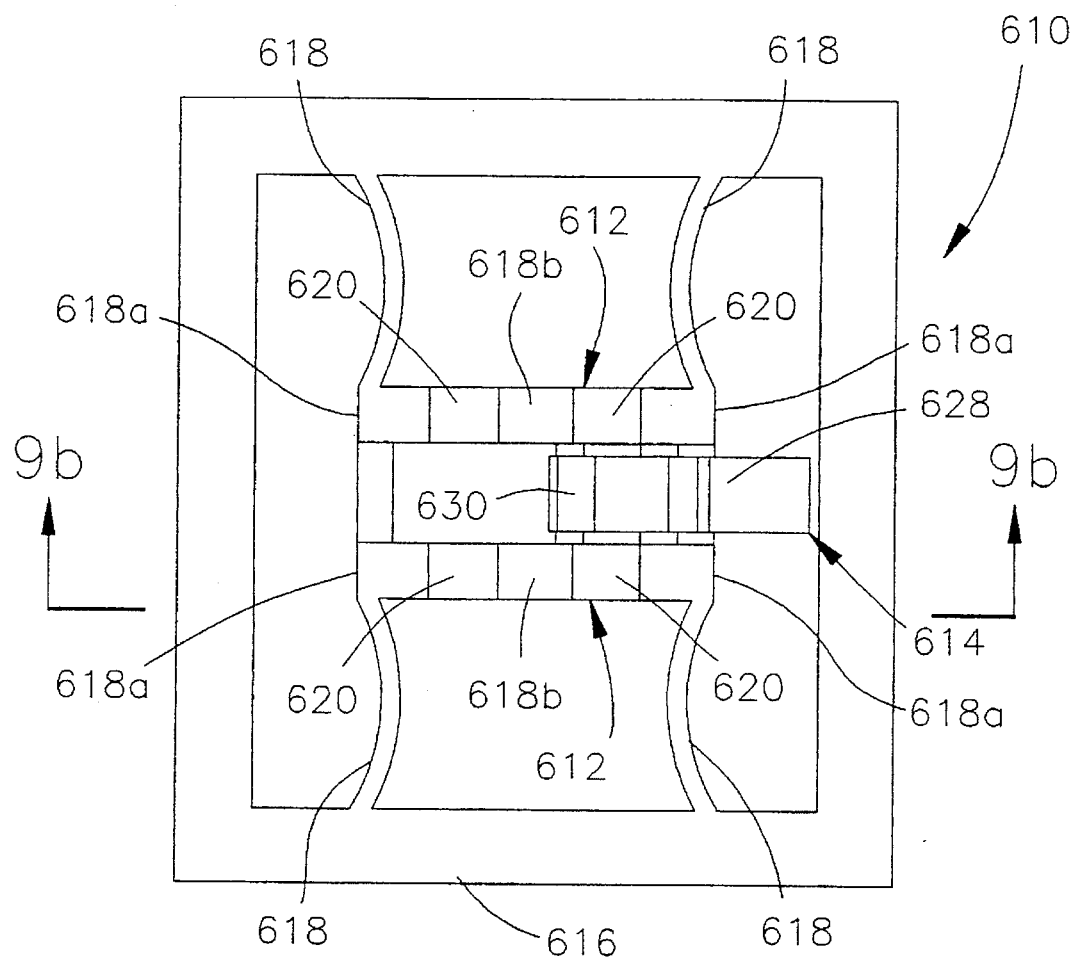
FIGS. 9a and 9b illustrate a bi-stable mechanism having a configuration which is a modification of that shown in FIG. 6.
Figure 9B:
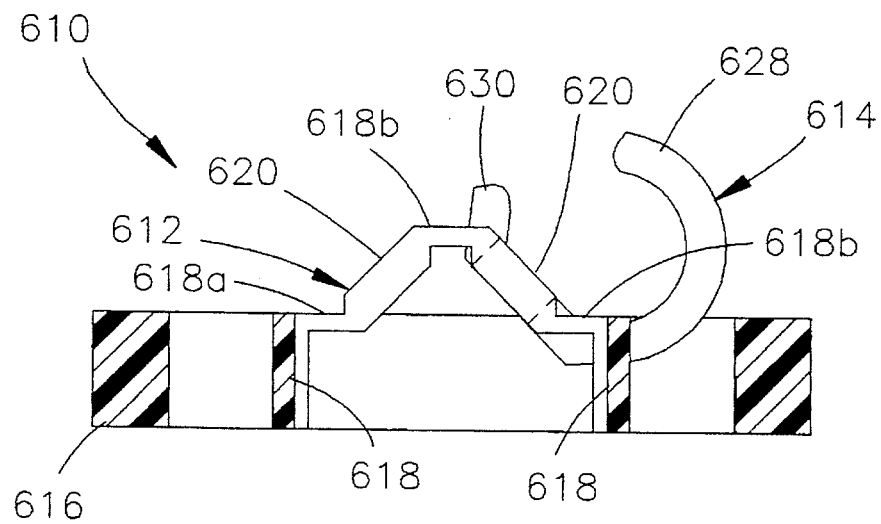

Another preferred manner for implementing the basic structure of the bi-stable mechanism of FIG. 6 is shown in FIGS. 9a and 9b. However, for this embodiment the orientation of the legs 518 is altered to yield a low profile fastener 610. As illustrated, a coupling member 614 of essentially the same design as that of FIGS. 8a and 8b is secured between a pair of bi-stable mechanisms 612. As can be seen in FIG. 9b, each bi-stable mechanism 612 is supported within an opening formed by a base 616 with a pair of legs 618, all of which approximately lie in the same plane. As such, the legs 618 and the base 616 lie within a plane which is substantially perpendicular to the plane in which the arms 620 travel when operating the fastener 610 between the release and fastening positions. Otherwise, the fastener 610 is substantially identical to the fastener 510 of FIGS. 8a and 8b, with each bi-stable mechanism 612 having a pair of arms 620 flexibly attached to each leg 618, with each leg 618 and arm 620 pairing forming a hinge 618a, and the arms 620 being flexibly attached to each other to form a third hinge 618b.

As seen in FIG. 9b, this construction allows the fastener 610 to have a much lower profile, enabling the fastener 610 to be used in applications having limited space or access. Furthermore, the fastener 610 can be more readily produced by a molding operation.

From the above, it can be seen that a significant advantage of the fastening systems of this invention is that a basic bi-stable structure can be employed to perform of variety of functions. Namely, the fastening systems are equipped to perform a snap and grip function in accordance with the embodiments of FIGS. 1a through 3, 6, 8a and 8b, with the option of including a locking feature in accordance with the embodiments of 2a through 3, a gathering and forming function in accordance with the embodiment of FIG. 4, a push out-to-secure function in accordance with the embodiment of FIG. 5. Each of these functions advantageously obviate the requirement for conventional threaded fasteners, and instead rely on the application of a linear force to install and activate the bi-stable mechanism. Additionally, each can be readily designed to generate a predictable clamping force as a result of the size and materials used for the flexing elements and the size of the members to be secured.

While our invention has been described in terms of a preferred embodiment, it is apparent that other forms could be adopted by one skilled in the art; for example, by modifying the shapes and sizes of the flexing elements. Accordingly, the scope of our invention is to be limited only by the following claims.

The embodiments of the invention in which an exclusive property or privilege is claimed are defined as follows:

1. A snap-action fastener comprising:

first and second legs spaced apart and having a pair of complementary ends, each of the first and second legs being formed so as to be resilient in bending;

first and second arms flexibly attached to the pair of complementary ends of the first and second legs, respectively, so as to form first and second hinges, respectively, the first and second arms being flexibly attached to each other so as to form a third hinge intermediate the first and second hinges, the length of the first and second arms between the pair of complementary ends of the first and second legs being greater than the distance between the pair of complementary ends such that the third hinge provides a snap-action during operation of the snap-action fastener between a release position and a fastening position; and a coupling member operatively associated with the first and second arms, the coupling member being configured to secure a first member to a second member when the first member is interconnected with the first and second legs and the snap-action fastener is in the fastening position, the coupling member comprising a plurality of resilient members projecting from a perimeter thereof so as to resiliently engage the first and second arms when the snap-action fastener is in the fastening position.

2. A snap-action fastener as recited in claim 1 wherein the coupling member is configured to be secured to the second member, the first and second arms have complementary ends, and the first and second arms are configured to clasp the coupling member when the snap-action fastener is in the fastening position in which the complementary ends of the first and second arms are adjacent each other.

3. A snap-action fastener as recited in claim 2 wherein the first and second arms are flexibly attached to the pair of complementary ends of the first and second legs at an intermediate point of each of the first and second arm.

4. A snap-action fastener as recited in claim 2 wherein the first and second arms have complementary arcuate shapes which form a substantially circular clasp when the snap-action fastener is in the fastening position.

5. A snap-action fastener as recited in claim 1 wherein the first and second arms have complementary ends, the complementary end of the first arm being engagable with the complementary end of the second arm so as to secure the first arm to the second arm.

6. A snap-action fastener as recited in claim 5 wherein the complementary end of the first arm comprises a coupling member, the complementary end of the second arm comprising:

first and second beams extending substantially in parallel from the complementary end of the second arm, the first and second beams being spaced apart and having a pair of complementary beam ends, each of the first and second beams being formed so as to be resilient in bending; and first and second locking arms flexibly attached to the pair of complementary ends of the first and second beams, respectively, so as to form first and second locking hinges, respectively, the first and second locking arms being flexibly attached to each other so as to form a third locking hinge intermediate the first and second locking hinges, the length of the first and second locking arms between the pair of complementary ends of the first and second beams being greater than the distance between the pair of complementary ends of the first and second beams such that the third locking hinge provides a snap-action during operation of the snap-action fastener between a release position and a fastening position, the first and second locking arms being configured to clasp the coupling member of the complementary end of the first arm when the snap-action fastener is in the fastening position.

7. A snap-action fastener as recited in claim 5 wherein the complementary ends of the first and second arms each have a serrated edge, the serrated edges being configured to interlock with each other when the snap-action fastener is in the fastening position.

8. A snap-action fastener as recited in claim 2 wherein the coupling member comprises a bundle of filament members.

9. A snap-action fastener as recited in claim 8 wherein the complementary end of the first arm has a guide member for engaging a surface of the second arm when the snap-action fastener is in the fastening position.

10. A snap-action fastener as recited in claim 8 wherein the first and second arms are configured to determine the cross-sectional shape of the bundle of filament members.

11. A snap-action fastener comprising:

first and second legs spaced apart and having a pair of complementary ends, each of the first and second legs being formed so as to be resilient in bending:

first and second arms flexibly attached to the pair of complementary ends of the first and second legs, respectively, so as to form first and second hinges, respectively, the first and second arms being flexibly attached to each other so as to form a third hinge intermediate the first and second hinges, the length of the first and second arms between the pair of complementary ends of the first and second legs being greater than the distance between the pair of complementary ends such that the third hinge provides a snap-action during operation of the snap-action fastener between a release position and a fastening position, the first and second arms having complementary ends oppositely disposed from the third hinge; and a coupling member operatively associated with the first and second arms, the coupling member being configured to secure a first member to a second member when the first member is interconnected with the first and second legs and the snap-action fastener is in the fastening position, the coupling member comprising a resilient member extending from the complementary end of each of the first and second arms, the resilient members being configured to engage the second member when the snap-action fastener is in the fastening position in which the complementary ends of the first and second arms are remote from each other.

12. A snap-action fastener as recited in claim 1 wherein each of the first and second arms have a first end and an oppositely disposed second end, the first end of the first arm being flexibly attached to the complementary end of the first leg so as to form the first hinge, the first end of the second arm being flexibly attached to the complementary end of the second leg so as to form the second hinge, and the second ends of the first and second arms being flexibly attached to each other so as to form the third hinge, and wherein the coupling member is fixedly attached to one of the first and second arms so as to pivot about a corresponding one of the first and second hinges during operation of the snap-action fastener between the release and fastening positions.

13. A snap-action fastener as recited in claim 12 wherein the coupling member is configured to abut the second member when the snap-action fastener is in the fastening position.

14. A snap-action fastener as recited in claim 13 wherein the coupling member has an arcuate shape with a support end spaced apart from an abutting end so as to form a gap therebetween, the support end being disposed adjacent the third hinge and the abutting end extending from a point adjacent one of the first and second hinges.

15. A snap-action fastener as recited in claim 12 wherein the coupling member is configured to secure the second member between the coupling member and one of the complementary ends of the first and second legs.

16. A snap-action fastener comprising:

first and second legs spaced apart and having a pair of complementary ends, each of the first and second legs being formed so as to be resilient in bending;

first and second arms flexibly attached to the pair of complementary ends of the first and second legs, respectively, each of the first and second arms have a first end and an oppositely disposed second end, the first end of the first arm being flexibly attached to the complementary end of the first leg so as to form a first hinge, the first end of the second arm being flexibly attached to the complementary end of the second leg so as to form a second hinge, and the second ends of the first and second arms being flexibly attached to each other so as to form a third hinge, the length of the first and second arms between the pair of complementary ends of the first and second legs being greater than the distance between the pair of complementary ends such that the third hinge provides a snap-action during operation of the snap-action fastener between a release position and a fastening position;

a coupling member fixedly attached to one of the first and second arms so as to pivot about a corresponding one of the first and second hinges during operation of the snap-action fastener between the release and fastening positions, the coupling member being configured to secure a member to the snap-action fastener when the snap-action fastener is in the fastening position; and wherein the first and second legs are secured to a base, the base and the first and second legs lying within a plane which is substantially perpendicular to a plane in which the first and second arms travel when operating the snap-action fastener between the release position and the fastening position.

17. A snap-action fastener comprising:

first and second legs spaced apart and having a pair of complementary ends, each of the first and second legs being formed so as to be resilient in bending;

first and second arms flexibly attached to the pair of complementary ends of the first and second legs, respectively, each of the first and second arms have a first end and an oppositely disposed second end, the first end of the first arm being flexibly attached to the complementary end of the first leg so as to form a first hinge, the first end of the second arm being flexibly attached to the complementary end of the second leg so as to form a second hinge, and the second ends of the first and second arms being flexibly attached to each other so as to form a third hinge, the length of the first and second arms between the pair of complementary ends of the first and second legs being greater than the distance between the pair of complementary ends such that the third hinge provides a snap-action during operation of the snap-action fastener between a release position and a fastening position;

a coupling member fixedly attached to one of the first and second arms so as to pivot about a corresponding one of the first and second hinges during operation of the snap-action fastener between the release and fastening positions, the coupling member being configured to secure a member to the snap-action fastener when the snap-action fastener is in the fastening position; and wherein the coupling member has an arcuate shape with a support end spaced apart from an abutting end so as to form a gap therebetween, the support end being disposed adjacent the third hinge and the abutting end extending from a point adjacent one of the first and second hinges.

18. A snap-action fastener comprising:

first and second legs spaced apart and having a pair of complementary ends, each of the first and second legs being formed so as to be resilient in bending;

first and second arms flexibly attached to the pair of complementary ends of the first and second legs, respectively, each of the first and second arms have a first end and an oppositely disposed second end, the first end of the first arm being flexibly attached to the complementary end of the first leg so as to form a first hinge, the first end of the second arm being flexibly attached to the complementary end of the second leg so as to form a second hinge, and the second ends of the first and second arms being flexibly attached to each other so as to form a third hinge, the length of the first and second arms between the pair of complementary ends of the first and second legs being greater than the distance between the pair of complementary ends such that the third hinge provides a snap-action during operation of the snap-action fastener between a release position and a fastening position;

a coupling member fixedly attached to one of the first and second arms so as to pivot about a corresponding one of the first and second hinges during operation of the snap-action fastener between the release and fastening positions, the coupling member being configured to secure a member to the snap-action fastener when the snap-action fastener is in the fastening position; and wherein the coupling member is configured to secure a second member between the coupling member and one of the complementary ends of the first and second legs.

* * * * *